(12) United States Patent
Almog

(10) Patent No.: US 9,194,686 B2
(45) Date of Patent: Nov. 24, 2015

(54) COMPACT 3D DIRECTION FINDER

(71) Applicant: ELTA SYSTEMS LTD., Ashdod (IL)

(72) Inventor: Benyamin Almog, Beit Arie (IL)

(73) Assignee: ELTA SYSTEMS LTD., Ashdod (IL)

( * ) Notice: Subject to any disclaimer, the term of this patent is extended or adjusted under 35 U.S.C. 154(b) by 0 days.

(21) Appl. No.: 14/706,337

(22) Filed: May 7, 2015

(65) Prior Publication Data

US 2015/0260500 A1    Sep. 17, 2015

Related U.S. Application Data

(63) Continuation of application No. 13/618,326, filed on Sep. 14, 2012, now Pat. No. 9,041,400.

(30) Foreign Application Priority Data

Sep. 18, 2011  (IL) .......................... 215197
Nov. 8, 2011  (IL) .......................... 216206

(51) Int. Cl.
   *G01V 3/06*   (2006.01)
   *G01R 33/12*  (2006.01)
   *G01B 7/004*  (2006.01)
   *G01R 33/02*  (2006.01)

(52) U.S. Cl.
   CPC ................ *G01B 7/004* (2013.01); *G01R 33/02* (2013.01)

(58) Field of Classification Search
   CPC ...................................................... G01V 3/15
   USPC ...................................................... 324/326
   See application file for complete search history.

(56) References Cited

U.S. PATENT DOCUMENTS

| 6,407,702 B1 | 6/2002 | Bergman et al. |
| 2009/0309788 A1 | 12/2009 | Welsh |
| 2010/0188308 A1 | 7/2010 | Honda et al. |

FOREIGN PATENT DOCUMENTS

| DE | 25 02 376 A1 | 7/1976 |
| GB | 2 274 953 A | 8/1994 |
| WO | 03/007422 A1 | 1/2003 |

OTHER PUBLICATIONS

Almog; "Chapter 2: Equivalent Circuits; Chapter 3: Detailed Design; and Chapter 4: Low Inductance Windings;" Maritime IIF DF Antenna Element—Intermediate Report; 2006.
Balanis; "Linear Wire Antennas;" Antenna Theory; 2007; Wiley, New York.
Balanis; "22.2: Multiple Antenna Design Parameters;" Modern Antenna Handbook; Section 22.2.2; 2008; Wiley, New York.

(Continued)

*Primary Examiner* — Bot Ledynh
(74) *Attorney, Agent, or Firm* — Oliff PLC

(57) ABSTRACT

An apparatus that includes two non-coinciding arrangements disposed in an two axes Cartesian coordinate system such that each arrangement having a non-zero projection on a respective axis from among the two axes. Each one of the arrangements includes a pair of oppositely directed, spaced apart, co-axial radiating-capable elements, each of the elements being hollow with internal space, and being slotted throughout its entire extent. A first circuitry coupled to the arrangement and being configured to sense an electric field projection along the axis and to convey it to a first feeding terminal. A second circuitry coupled to a slot of the arrangement and being configured to sense a magnetic field's projection along said axis and to convey it to a first feeding terminal.

2 Claims, 12 Drawing Sheets

(56) References Cited

OTHER PUBLICATIONS

Rhode & Schwartz Antennas HF-VHF/UHF-SHF Catalog; 2006/2007; pp. 18-19.

Bergman et al; "LOIS as Radio observatory, Interfermoetry with 3D vector sensors;" LOIS Workshop; Nov. 2004; Sweden.

Smith et al; Section 26.3: "Antenna Polarization and Polarization Synthesis" excerpt from "Circular Polarization in F-M Broadcasting;" Electronics; Sep. 1948; vol. 21.

Park et al; "Chapter 6: Receiving Antennas;" Antenna HDBK; pp. 6-16 to 6-18.

Smith; "Loop antennas;" Antenna Engineering Handbook; 1984; pp. 5-6 to 5-8.

Pettingill et al; "Receiving Antenna Design for Miniature Receivers;" IEEE Transactions on Antenna and Propagation; Jul. 1977; pp. 528-530.

Wheeler; "Small Antennas;" IEEE Transactions on Antenna and Propagation; Jul. 1975; pp. 462-469.

Kennedy; "Loop Antenna Measurements;" IRE Transactions on Antenna and Propagation; Oct. 1956; pp. 610-618.

"Rec. ITU-R P.372-9;" pp. 4-7 and 5-16.

Image taken from HATKE; "Performance analysis of the superCART antenna array;" Project Rep. AST-22; Mar. 1992; MIT Lincoln Lab; Lexington, MA.

"TI: Conditions for unambiguous source location using polarization diverse arrays;" pp. 1365-1369.

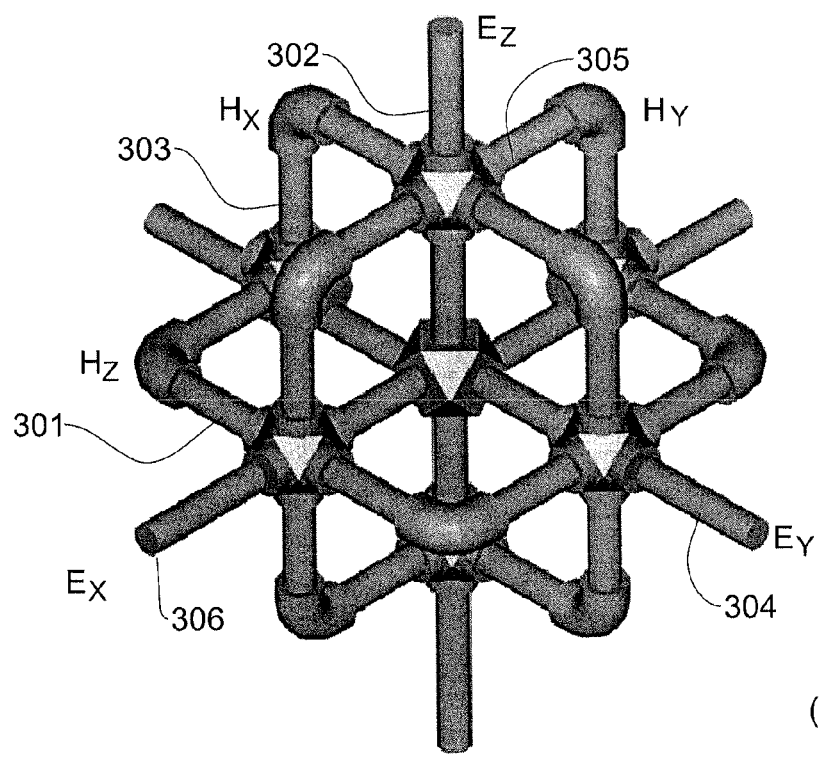
FIG. 3
(PRIOR ART)
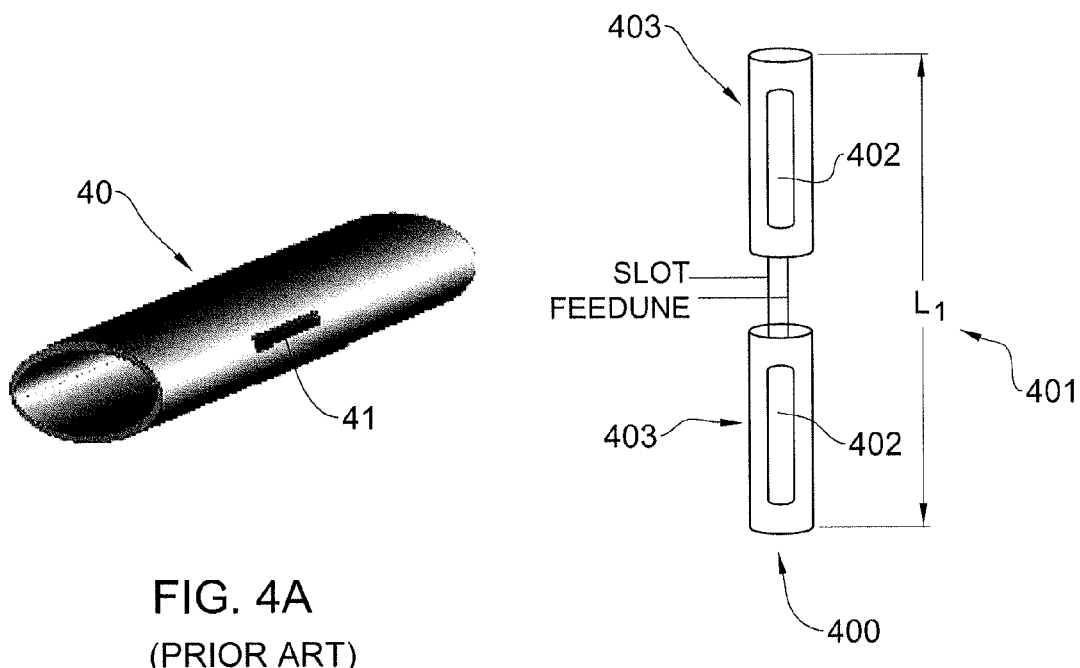
FIG. 4A
(PRIOR ART)
FIG. 4B
(PRIOR ART)

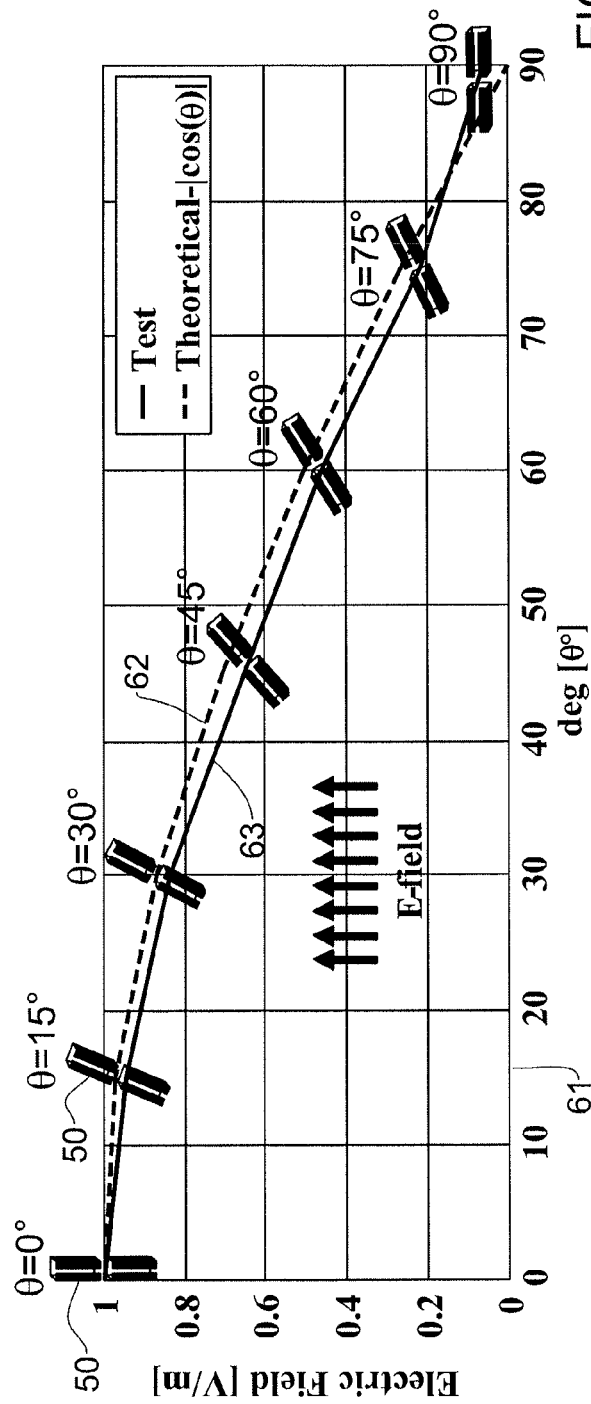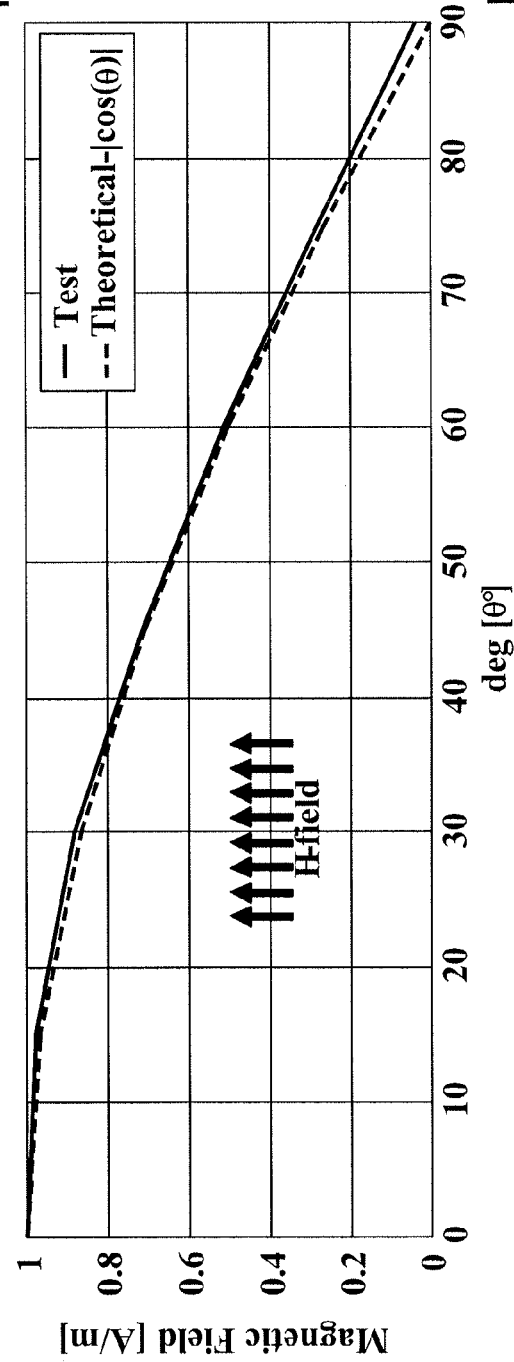
FIG. 6A
FIG. 6B

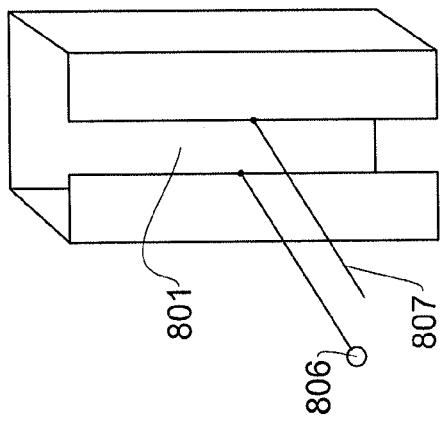
FIG. 8C
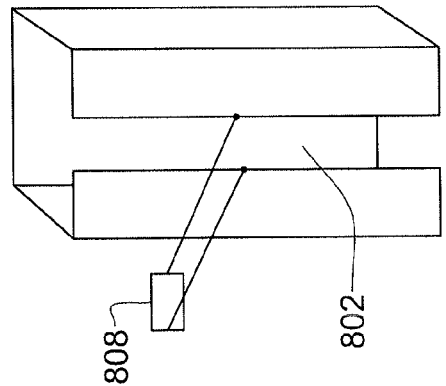
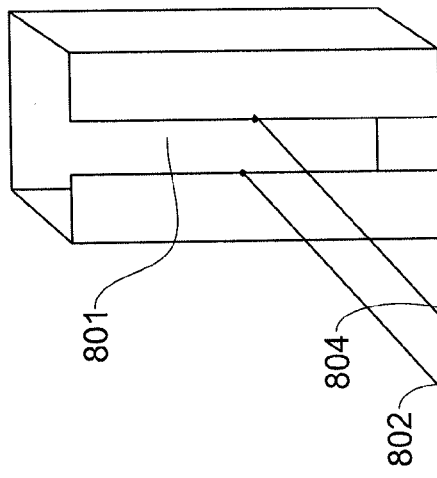
FIG. 8B
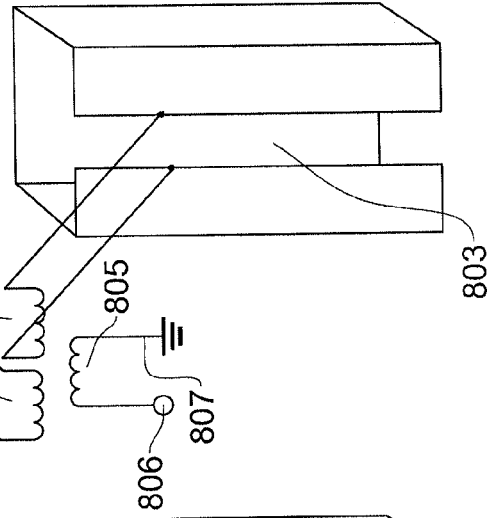
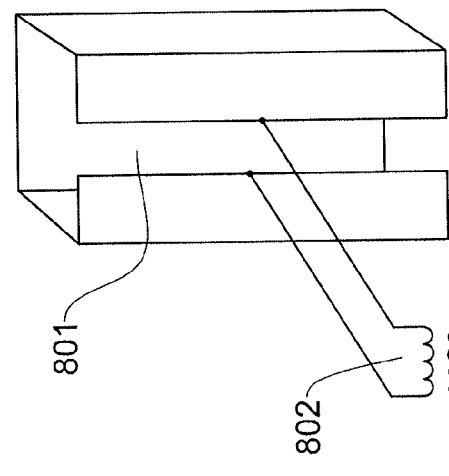
FIG. 8A
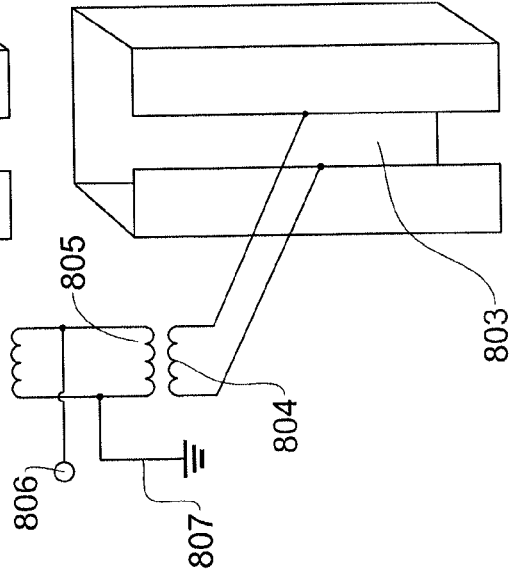

COMPACT 3D DIRECTION FINDER

CROSS-REFERENCE TO RELATED APPLICATION

This is a Continuation of application Ser. No. 13/618,326 filed Sep. 14, 2012, which claims the benefit of Israeli Application No. 215197 filed Sep. 18, 2011, and Israeli Application No. 216206 filed Nov. 8, 2011. The disclosure of the prior applications is hereby incorporated by reference herein in its entirety.

FIELD OF THE INVENTION

This invention relates generally to the field of direction finding.

BACKGROUND OF THE INVENTION

There are many fields in which measurements of electric or magnetic fields are utilized for resolving the direction of arrival of electro-magnetic (EM) wavefronts. These may be used, for example, in a system for determining spatial geo-location of emitters applicable in search or rescue applications.

There are also applications in which mutual co-located measurement of both the electric and magnetic fields are required.

As is well known, an electric dipole of length l is considered a small dipole (in terms of wavelength) when l<<k, in that range, and approximation of the current distribution is uniform, which allows calculation of the radiated fields. In the far-field region (kr>>1) E and H-fields radiated by a small dipole aligned with the $\hat{z}$ axis comply with the following equation (1):

$$\left. \begin{array}{l} E_\theta = j\eta \dfrac{kI_0 l e^{-jkr}}{8\pi r} \sin(\theta) \\ E_r = E_\phi = H_r = H_\theta = 0 \\ H_\phi = j \dfrac{kI_0 l e^{-jkr}}{8\pi r} \sin(\theta) \end{array} \right\} kr \gg 1 \quad (1)$$

where $I_0$ is a constant. Note that for sensing an electric field in the Z axis, $E_\theta$ is the electric field value of interest.

Turning now to magnetic fields, for the small current loop (in terms of wavelength, (l<<kr) the current distribution is given by $I_\phi = I_0$ where $I_0$ is a constant.

The electric and magnetic fields in a far-field (kr>>1) region for a small magnetic loop are given by:

$$\left. \begin{array}{l} H_\theta = -\dfrac{(ka)^2 I_0 e^{-jkr}}{4r} \sin(\theta) \\ E_\phi = \eta \dfrac{(ka)^2 I_0 e^{-jkr}}{4r} \sin(\theta) \\ E_r = E_\theta = H_r = H_\phi = 0 \end{array} \right\} kr \gg 1 \quad (2)$$

Note that for sensing a magnetic field in the Z axis (coinciding with the specified Z axis direction of $E_\theta$) $H_\theta$ is the magnetic field value of interest.

As is well known, the electric dipole responds to an electric field aligned with a dipole axis while the current loop responds to a magnetic field perpendicular to its containing plane.

When two or more antennae are in the vicinity of each other, whether one and/or more are transmitting or receiving, some of the energy that is primarily intended for one antenna ends up at the other antenna, giving rise to mutual coupling. The amount depends, amongst others, on:

a. radiation characteristics of each antenna
b. relative distance between the antennas
c. relative orientation of the antennas
d. port loading (impedance of the load)

Mutual coupling may be distractive to the ability to sense specific field components by an antenna element in the vicinity of another antenna element targeting other field components, since part of the energy related to undesired components may leak through mutual coupling and distort the desired component sense.

There are different systems for sensing electric fields and magnetic fields. Systems include the R&S HM-020 shown for instance in FIG. 1, that is composed of three current loops (101 to 103), disposed perpendicularly to each other and which are capable of sensing a magnetic field (only) in three perpendicular directions, respectively. The device of Bergman et al. as shown in FIG. 2 is composed of three dipoles (201 to 203) that are disposed perpendicularly to each other and are capable of sensing an electric field (only) in three perpendicular directions, respectively.

Turning now to known co-located systems, attention is drawn to FIG. 3, illustrating schematically a co-located device for measuring magnetic and electric fields, in accordance with the prior art. As shown, the system includes three distinct co-axial arrangements where ring 301 and coaxial dipole 302, disposed perpendicularly thereto, are capable of sensing a respective magnetic field and electric field projections, in the Z direction. Similarly, ring 305 and coaxial dipole 304, disposed perpendicularly thereto, are capable of sensing a respective magnetic field and electric field projections, in the Y direction. And, ring 303 and coaxial dipole 306, disposed perpendicularly thereto, are capable of sensing a respective magnetic field and electric field projections, in the X direction.

The measurements of the projections of the electric and magnetic fields along the Z, Y and X axes can further be utilized for the calculation of the properties (including propagation direction) of the electro-magnetic (EM) wavefront, by applying the Poynting Theorem. According to the latter, an electromagnetic wavefront has a unique relation between the electric and magnetic field components to its direction of propagation by $$\overline{S} = \frac{1}{2} \overline{E} \times \overline{H^*} \quad (1)$$

where $\overline{E}$ and $\overline{H}$ are phasors. The magnitudes $|\overline{E}|$ and $|\overline{H}|$ are peak values, and therefore the RMS values are $$|\overline{E}|/\sqrt{2}$$

and $$|\overline{H}|/\sqrt{2},$$

respectively. The $\overline{S}$ vector gives the direction and the RMS value of the complex power flux density. By knowing the field components, the direction of propagation is uniquely determined. Note that the direction of arrival of such a wavefront would be determined to be opposite to the direction of propagation. Note that generally the $\overline{S}$ direction may be represented in a given coordinates system with origin located at the measurement point by an azimuth angle ($\phi$) and an elevation angle ($\theta$) at this coordinates system.

There are a number of limitations in the system depicted in FIG. 3, including:
- relatively high mutual coupling
- cumbersome feed circuitry (6 feeds)
- more sensitivity to electric field than a corresponding proportional magnetic field.

Turning now to FIG. 4A, it illustrates a slot cut in a generalized structure, according to the prior art. As shown, a slot antenna 40 is produced by creating a thin slot of length h 41 in a conducting metal sheet and feeding it into the center of the slot (not shown). The radiation pattern of a slot antenna is identical to that of the electric dipole of the same length, except that orientations of the E and H fields are interchanged. This means that the magnetic dipole can be replaced by a slot.

Turning now to FIG. 4B, it illustrates schematically a co-located device for measuring magnetic and electric fields (utilizing the specified concept of a slotted element), in accordance with the prior art. The device had been first suggested by Smith et al. for polarization synthesis, however, this prior construction requires tight dimensions of the elements in terms of wavelength. In other words, the longitudinal dimension of the device 401 should be substantially identical to the wavelength $\lambda$ of the sensed fields, and therefore must be customized to each specific wavelength $\lambda$ of the sensed field. This constraint stems from the fact that the original form of feeding circuitry to slots 402 affects the electric dipole (shorts it) unless the electric dipole's arms 403 are half wavelength ($\lambda$) each. Note that this shortcoming renders the apparatus practically infeasible for sensing fields at rather low frequency (2-30 MHz) as the latter imposes a very large apparatus size. Considering also the apparatus described with reference to FIG. 3, there is, thus, a need in the art to provide for a new co-located apparatus for resolving the direction of arrival of an electro-magnetic (EM) wavefront.

SUMMARY OF THE INVENTION

In accordance with an aspect of the presently disclosed subject matter, there is provided an apparatus, comprising at least two non-coinciding arrangements disposed in an at least two axes Cartesian coordinate system such that each arrangement having a non-zero projection on a respective axis from among the at least two axes; each one of the arrangements includes at least one pair of oppositely directed, spaced apart, co-axial radiating-capable elements, each of the elements being hollow with internal space, and being slotted throughout its entire extent; a first circuitry coupled to the arrangement and being configured to sense an electric field projection along the axis and to convey it to a first feeding terminal; a second circuitry coupled to at least one slot of the arrangement configured to sense a magnetic field's projection along said axis and to convey it to a first feeding terminal.

In accordance with an embodiment of the presently disclosed subject matter, there is further provided an apparatus, wherein each arrangement has a first longitudinal dimension and is capable of sensing a magnetic field projection along the axis and an electric field projection along the axis in a decade frequency band where the first longitudinal dimension is smaller than $\lambda_{MIN}/10$ and where $\lambda_{MIN}$ corresponds to the highest frequency of the frequency band.

In accordance with an embodiment of the presently disclosed subject matter, there is further provided an antenna, wherein the first circuitry includes passive elements. In accordance with an embodiment of the presently disclosed subject matter, there is yet further provided an apparatus wherein the passive elements include a transformer.

In accordance with an embodiment of the presently disclosed subject matter, there is yet further provided an apparatus, wherein the first circuitry includes active elements.

In accordance with an embodiment of the presently disclosed subject matter, there is yet further provided an apparatus, wherein the active elements include a differential amplifier.

In accordance with an embodiment of the presently disclosed subject matter, there is yet further provided an apparatus, wherein each element in any of the arrangements being a hollow cylinder slotted throughout its entire longitudinal extent.

In accordance with an embodiment of the presently disclosed subject matter, there is yet further provided an apparatus, wherein each element being a hollow polygon slotted throughout its entire longitudinal extent.

In accordance with an embodiment of the presently disclosed subject matter, there is yet further provided an apparatus wherein the first circuitry is coupled to an arrangement in a gap between the elements.

In accordance with an embodiment of the presently disclosed subject matter, there is yet further provided an apparatus, wherein the second circuitry includes passive elements.

In accordance with an embodiment of the presently disclosed subject matter, there is yet further provided an apparatus wherein the passive elements include a transformer. In accordance with an embodiment of the presently disclosed subject matter, there is yet further provided an apparatus, wherein the second circuitry includes active elements. In accordance with an embodiment of the presently disclosed subject matter, there is yet further provided an apparatus, wherein the active elements include a differential amplifier. In accordance with an embodiment of the presently disclosed subject matter, there is yet further provided an apparatus, wherein the passive elements are coupled to an arrangement by a galvanic combination of one slot center, while all other of the slots are loaded for symmetry.

In accordance with an embodiment of the presently disclosed subject matter, there is yet further provided an apparatus, wherein the passive elements are coupled to an arrangement by a galvanic combination to each slot center of the slots.

In accordance with an embodiment of the presently disclosed subject matter, there is yet further provided an apparatus, wherein the passive elements include at least one magnetic element accommodated within the spaces of the at least one pair of elements and extending along a major portion of the elements' longitudinal extent. In accordance with an embodiment of the presently disclosed subject matter, there is yet further provided an apparatus, wherein the magnetic element includes a multi-turn loop over a ferrite rod.

In accordance with an embodiment of the presently disclosed subject matter, there is yet further provided an apparatus, wherein the element is coupled to the slots for sensing the accumulated magnetic field projection.

In accordance with an embodiment of the presently disclosed subject matter, there is yet further provided an apparatus, wherein at least one of the arrangements having a non-zero projection on an additional axis from among the at least two axes.

In accordance with an embodiment of the presently disclosed subject matter, there is yet further provided an apparatus, wherein at least one of the arrangements having additional at least one non-zero projection on additional at least one axis from among the at least two axes.

In accordance with an embodiment of the presently disclosed subject matter, there is yet further provided an apparatus, wherein the arrangements are disposed perpendicularly to each other.

In accordance with an embodiment of the presently disclosed subject matter, there is yet further provided an apparatus, wherein the arrangements are disposed along the at least two axes.

In accordance with an embodiment of the presently disclosed subject matter, there is yet further provided an apparatus, wherein each one of the arrangements is spaced apart relative to the origin of the Cartesian system at a respective distance that falls in the range of 0 to $\lambda_{MIN}$, where $\lambda_{MIN}$ corresponds to the highest frequency of a decade frequency band.

In accordance with an embodiment of the presently disclosed subject matter, there is yet further provided an apparatus for resolving the direction of arrival of an electro-magnetic (EM) wavefront.

In accordance with an embodiment of the presently disclosed subject matter, there is yet further provided an apparatus for resolving the polarization of an electro-magnetic (EM) wavefront.

In accordance with an embodiment of the presently disclosed subject matter, there is yet further provided an apparatus, comprising three non-coinciding arrangements disposed in three axes Cartesian coordinate system such that each arrangement having a non-zero projection on a respective axis from among the three axes.

In accordance with an embodiment of the presently disclosed subject matter, there is yet further provided an apparatus, comprising two non-coinciding arrangements disposed in two axes Cartesian coordinate system such that each arrangement having a non-zero projection on a respective axis from among the two axes.

In accordance with an aspect of the presently disclosed subject matter, there is yet further provided an apparatus comprising at least two mutually perpendicular antennae for measuring electric and magnetic field projections along at least two distinct axes; each antenna from among the antennae includes:
(a) an arrangement that includes at least one pair of oppositely directed, spaced apart, co-axial radiating-capable elements, each of the elements being hollow with internal space, and being slotted throughout its entire extent; a first circuitry coupled to the arrangement and being configured to sense an electric field projection along the axis and to convey it to a first feeding terminal;
(b) a second circuitry coupled to at least one slot of the arrangement configured to sense a magnetic field's projection along the axis and to convey it to a first feeding terminal;
(c) the antennae are coupled to at least one receiver for measuring the sensed electric and magnetic projections in each one of the axes.

In accordance with an embodiment of the presently disclosed subject matter, there is yet further provided an apparatus comprising three mutually perpendicular antennae for measuring electric and magnetic field projections along three distinct axes. In accordance with an embodiment of the presently disclosed subject matter, there is yet further provided an apparatus comprising two mutually perpendicular antennae for measuring electric and magnetic field projections along two distinct axes. In accordance with an aspect of the presently disclosed subject matter, there is yet further provided a method for determining direction of arrival of an electromagnetic (EM) wavefront, comprising:
(i) providing at least two non-coinciding arrangements disposed in at least two axes Cartesian coordinate system such that each arrangement having a non-zero projection on a respective axis from among the at least two axes; each one of the arrangements includes at least one pair of oppositely directed, spaced apart, co-axial radiating-capable elements, each of the elements being hollow with internal space, and being slotted throughout its entire extent; a first circuitry coupled to the arrangement and a second circuitry coupled to at least one slot of the arrangement
(ii) utilizing the first circuitry for sensing an electric field projection along the axis and to convey it to a first feeding terminal;
(iii) utilizing the second circuitry for sensing a magnetic field's projection along the axis and to convey it to a first feeding terminal; and
(iv) utilizing the at least two arrangements for resolving the direction of arrival of an electro-magnetic (EM) wavefront.

In accordance with an embodiment of the presently disclosed subject matter, there is yet further provided a method comprising:
(i) providing three non-coinciding arrangements disposed in three axes Cartesian coordinate system such that each arrangement having a non-zero projection on a respective axis from among the three axes; each one of the arrangements includes at least one pair of oppositely directed, spaced apart, co-axial radiating-capable elements, each of the elements being hollow with internal space, and being slotted throughout its entire extent; a first circuitry coupled to the arrangement and a second circuitry coupled to at least one slot of the arrangement;
(ii) utilizing the first circuitry for sensing an electric field projection along the axis and to convey it to a first feeding terminal;
(iii) utilizing the second circuitry for sensing a magnetic field's projection along the axis and to convey it to a first feeding terminal; and
(iv) utilizing the three arrangements for resolving the direction of arrival of an electro-magnetic (EM) wavefront.

In accordance with an embodiment of the presently disclosed subject matter, there is yet further provided a method comprising:
(i) providing two non-coinciding arrangements disposed in two axes Cartesian coordinate system such that each arrangement having a non-zero projection on a respective axis from among the two axes; each one of the arrangements includes at least one pair of oppositely directed, spaced apart, co-axial radiating-capable elements, each of the elements being hollow with internal space, and being slotted throughout its entire extent; a first circuitry coupled to the arrangement and a second circuitry coupled to at least one slot of the arrangement;
(ii) utilizing the first circuitry for sensing an electric field projection along the axis and to convey it to a first feeding terminal;
(iii) utilizing the second circuitry for sensing a magnetic field's projection along the axis and to convey it to a first feeding terminal; and (iv) utilizing the two arrangements for resolving the direction of arrival of an electro-magnetic (EM) wavefront.

In accordance with an embodiment of the presently disclosed subject matter, there is yet further provided a system that includes at least one pair of apparatuses, each apparatus being constructed in accordance with the presently disclosed subject matter; each pair of said pairs of apparatuses is coupled substantially symmetrically over a substantially symmetric object having at least one symmetric plan in a manner that substantially maintains an original symmetric plan of said plans when considering a consolidated structure that is composed of the object and the pair of apparatuses.

In accordance with an embodiment of the presently disclosed subject matter, there is yet further provided a system wherein the electric field projection measurement of each arrangement of a first apparatus of said pair is combined with the electric field projection measurement of a corresponding arrangement of the second apparatus of said pair, giving rise to combined electric field projection measurements respectively; and wherein the magnetic field projection measurement of each arrangement of the first apparatus is combined with the magnetic field projection measurement of a corresponding arrangement of the second apparatus, giving rise to combined magnetic field projection measurements respectively.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 3 illustrates schematically a co-located device for measuring magnetic and electric fields, in accordance with the prior art;

FIG. 4A illustrates a slot cut in generalized structure, according to the prior art;

FIG. 4B illustrates schematically a co-located device for measuring magnetic and electric fields, in accordance with the prior art;

FIGS. 6A-B illustrate a sensed magnetic/electric field intensity as a function of the antenna arrangement orientation relative to the z axis;

FIGS. 8A-C illustrate schematically three respective second circuitries, for conveying sensed magnetic fields, in accordance with certain embodiments of the invention;

DETAILED DESCRIPTION OF EMBODIMENTS

Figure 1:
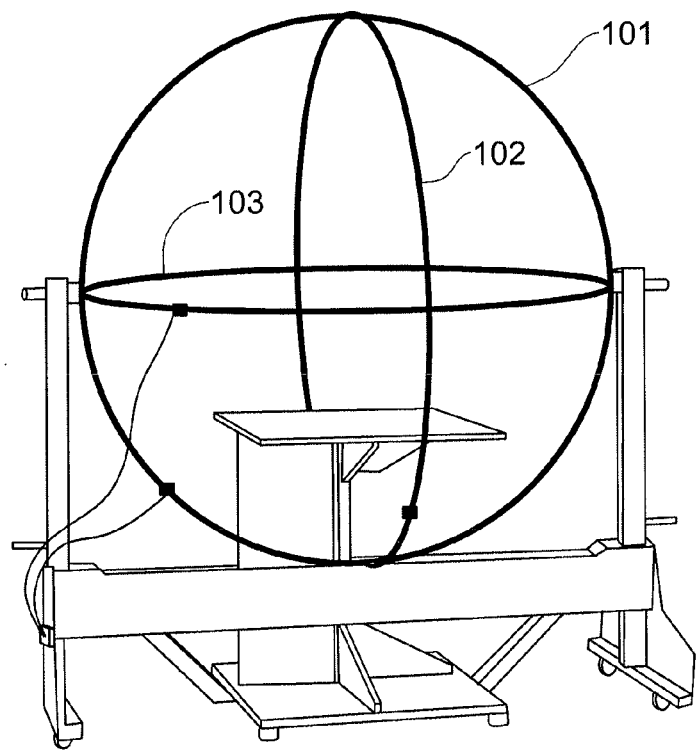
FIG. 1 is a schematic illustration of a device capable of sensing a magnetic field only, in accordance with the prior art.
Figure 2:
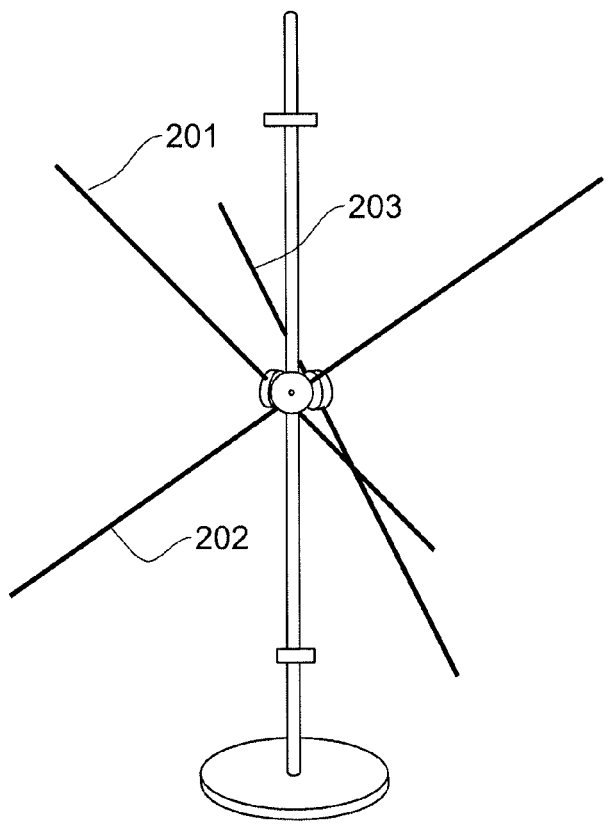
FIG. 2 is a schematic illustration of a device capable of sensing an electric field only, in accordance with the prior art.
Figure 5A:
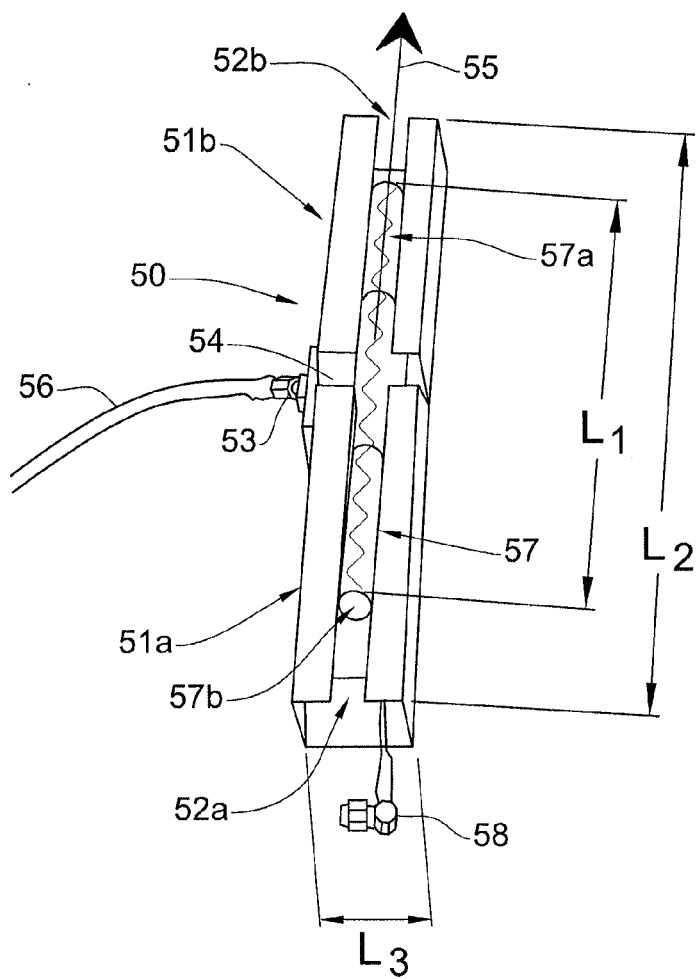
FIG. 5A illustrates schematically co-located electric and magnetic antenna elements, in accordance with certain embodiment of the invention.

Attention is now drawn to FIG. 5A illustrating schematically a co-located electric and magnetic dipoles antenna, in accordance with a certain embodiment of the invention. As shown, an arrangement 50 includes a pair of oppositely directed, spaced apart, co-axial hollow radiating-capable elements (51a and 51b, respectively). Each element (either 51a or 51b) is slotted throughout its entire extent (52a and 52b, respectively). A first circuitry 53 is coupled to the arrangement (by this example to the gap 54 between the elements) for sensing an electric field projection along the axis 55. The sensed field is conveyed by the first circuitry to a first feeding terminal (not shown in FIG. 5A) and therefrom through a coax cable 56 to a measurement apparatus (not shown in FIG. 5A). Note that the elements may be connected e.g. mechanically by non-galvanic (isolating) connectors (not shown in the Figs.)

Also shown in FIG. 5A, is a second circuitry that is coupled to the arrangement, by this particular example to the slots of the pair of elements (all as described in more detail below), for sensing a magnetic field projection along the axis 55. The sensed field is conveyed by the second circuitry 58 to a second feeding terminal and therefrom, e.g. through a coax cable to a measuring apparatus (not shown in FIG. 5A).

By the specific example of FIG. 5A, the hollow in each element (51a, 51b) includes internal space accommodating the second circuitry that includes a magnetic element 57 extending along at least a major portion ($l_1$) of the arrangement's longitudinal extent ($l_2$). In accordance with certain embodiments, the magnetic element 57 includes a multi turn loop 57a over a ferrite rod 57b. By this embodiment, the second circuitry is coupled to the slots of the arrangement by non galvanic coupling of the magnetic element 57 (all as explained in greater detail below). The structure and operation of an exemplary element is described in "*Maritime HF DF Antenna Element—Intermediate Report*" by Benny Almog, published in 2006, where chapter 2 describes Equivalent Circuits, chapter 3 describes a Detailed Design and chapter 4 describes Low Inductance Windings.

In accordance with certain embodiments, each element (either 51a or 51b) is slotted throughout a major portion of its longitudinal extent.

In accordance with a certain embodiments, each electric dipole element is a hollow cylinder.

Figure 5B:
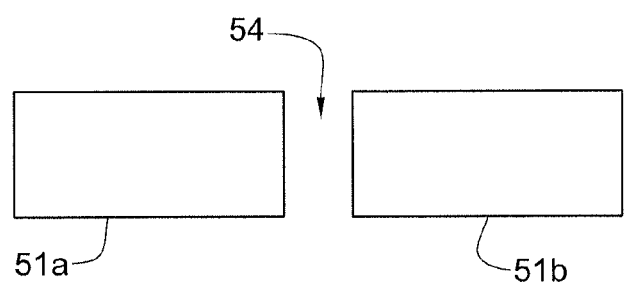
FIGS. 5B-C illustrate respective side and rear views of an antenna arrangement of FIG. 5A.
Figure 5C:
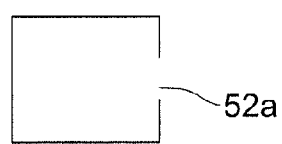

In accordance with a certain embodiments, each electric dipole element is a hollow polygon having a lateral extent. In the case of a polygon of a square cross section (having a lateral extent $l_3$), a rear view of the arrangement is shown in FIG. 5B (depicting elements 51a and 51b and gap 54) and a side view thereof is shown in FIG. 5C (illustrating also a slot cross section, say 52a).

By a specific non limiting example, each electric dipole element is 26 cm long and has a square (4×4 cm) cross section.

Note that in accordance with certain embodiments, the apparatus is designed to operate in a decade frequency band, where the arrangement's length is smaller than $\lambda_{MIN}/10$ (where $\lambda_{MIN}$ corresponds to highest frequency of the frequency band).

Note that the invention is not bound to these specific specifications.

By the specific example illustrated above, for an arrangement length of 26 cm, $\lambda_{MIN}$=10 m (0.26<10/10) and $f_{MAX}$=30 MHz.

In accordance with certain embodiments, in operation, in the presence of an electric field, the first circuitry will sense the electric field projection developed along axis 55 and then convey it to a feeding terminal (not shown) and therefrom through the connector 56 (e.g. coax cable) to a known per se receiver apparatus (not shown in FIG. 5). In the presence of a magnetic field, the circuitry (by this particular embodiment the multi turn loop 57a over a ferrite rod 57b) will sense the accumulated magnetic field projection received in both slots (along the specified axis 55) and it will be conveyed to the feeding terminals (not shown). The sensed magnetic field projection will then be conveyed through. e.g. a coax cable to a known per se receiver (not shown in FIG. 5A).

Note that the invention is not bound by the specific structure of the antenna, depicted in FIGS. 5A-C. For instance, more than one pair of elements may be employed.

The sensed electric field projection complies with $E_\theta$ of equation (1) above. Similarly, the sensed magnetic field projection complies with $H_\theta$ of equation (2) above.

It should be noted that the longitudinal extent of the arrangement refers to the field projection's axes and the lateral extent refers to the cross section of the arrangement even in those embodiments where the lateral extent is larger than the longitudinal extent (e.g. $l_3 > l_2$).

Turning now to FIGS. 6A-B illustrating a sensed magnetic/electric field intensity as a function of the antenna arrangement orientation relative to an axis of interest, say the z axis. Thus, as shown in FIG. 6A, depending on the orientation of the arrangement 50 relative to the z axis (with an ever-increasing tilt angle θ, see the abscissa 61) the sensed electric field intensity 62 (see the ordinate in FIG. 6A) drops, such that the higher the angle θ the lower the intensity of the sensed fields along the z axis (in compliance with cos(θ)). Note that graph 63 depicts the test results compared to the theoretical value (graph 62). A corresponding behavior for the magnetic field response is depicted in FIG. 6B.

Note that in accordance with certain embodiments, and in contrast to the prior art, an antenna employing an arrangement of the kind specified is capable of sensing a magnetic field projection along the specified axis and an electric field projection along the same axis, substantially irrespective of the wavelength of said fields.

In accordance with certain embodiments, the wavelength (λ) affects the k parameter in the specified equations, and consequently the intensity of the sensed field is affected, such that the larger the wavelength, the lesser the sensed field.

Note that the invention is not bound by the antenna architecture as depicted in FIG. 5A.

Figure 7A:
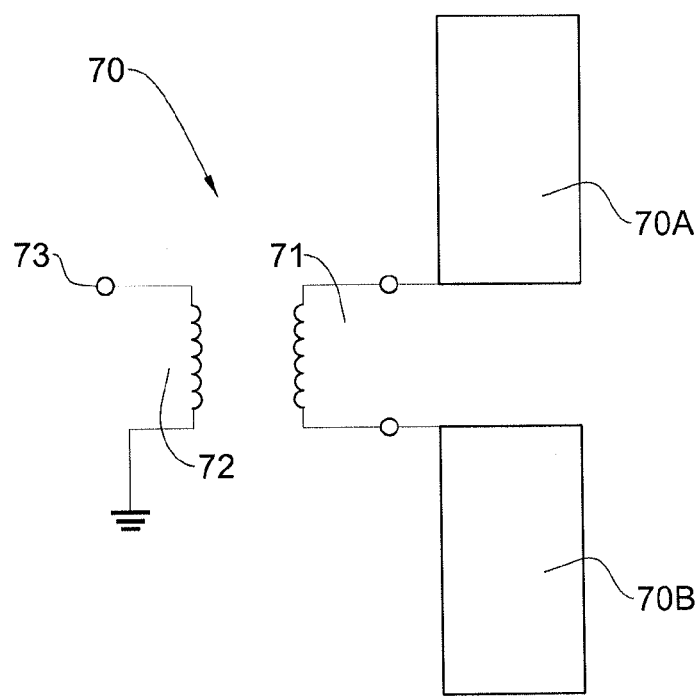
FIGS. 7A-B illustrate schematically respective passive and active first circuitries, for conveying a sensed electric field, in accordance with certain embodiments of the invention.
Figure 7B:
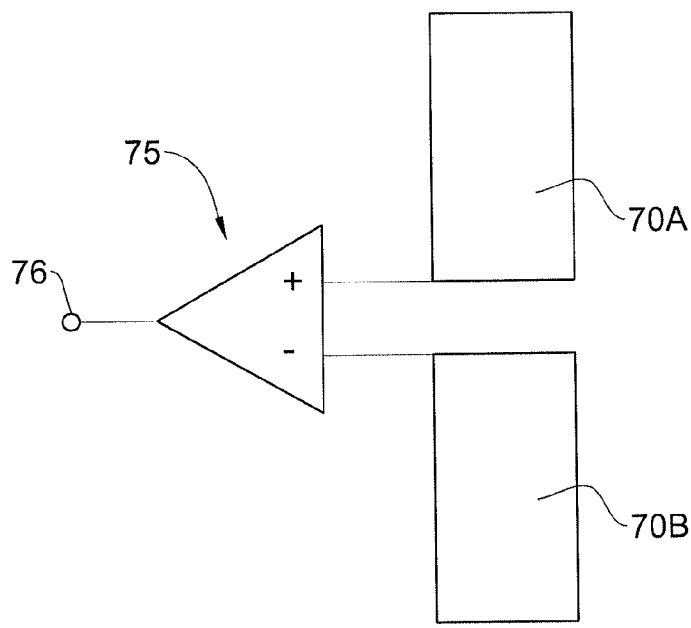

Turning now to FIGS. 7A-B, they illustrate, schematically, respective passive and active first circuitries, for conveying a sensed electric field, in accordance with certain embodiments of the invention. Thus, as shown in FIG. 7A, a first circuitry 70 (e.g. coupled to the gap between the elements 70A and 70B of the arrangement) consists of passive elements (e.g. transformer) 71 and 72 and conveys the sensed electric field projection to a feed terminal 73 and therefrom to a receiver (not shown in the Fig). This may be implemented e.g. by a known per se Balun. A Balun is useful typically, although not necessarily, when a coax cable is used. In accordance with the example of FIG. 7B, the first circuitry consists of an active element, say a differential amplifier 75 for conveying the sensed electric field through feed terminal 76 to a receiver (not shown). Note that the invention is not bound by the specified examples (see for example also the description with reference to FIG. 8, below).

Turning now to FIGS. 8A-C, they illustrate schematically three respective second circuitries, for conveying a sensed magnetic field, in accordance with certain embodiments of the invention.

Turning at first to FIG. 8A, it illustrates one embodiment of a second circuitry. Thus, the magnetic field projection received in a slot 801 of one element of the pair is coupled (at the slot center) to coil 802, and similarly the magnetic field projection received in a slot 803 of another element of the pair is coupled (at the slot center) to coil 804 and the cumulative energy collected by both coils is coupled in a galvanic connection (e.g. induced) to coil 805 and conveyed to the receiver by means of a feeding terminal 806 where 807 is grounded.

Turning now to FIG. 8B, it illustrates yet another embodiment of a second circuitry. Thus, the magnetic energy projection constituents received in slots 801 and 803 will be collected (non-galvanic) from the slot centers to primary coils 802 and 804, respectively, and induced to a common secondary 805 and therefrom conveyed to a receiver (not shown) through terminal feed 806 (where port 807 is grounded).

Turning to FIG. 8C, it illustrates yet another embodiment of a second circuitry. Thus, the magnetic energy projection constituent received in slot 801 is conveyed (from the slot center through feed terminal 806, while the other slot 803 is terminated by a load in a known per se manner 808 for symmetry. Note that considering that the magnetic field projection is sensed through only one element of the pair, this obviously will result in lesser sensitivity than the alternative of sensing both elements of the pair.

Note that the invention is not bound by the specified second circuitry architectures. Thus, for example utilizing a passive element, like coils, in the manner described by way of non limiting example with reference to FIGS. 8A-C, is not binding. Moreover, the implementation of the second circuitry within the space of the arrangement (as depicted e.g. in FIG. 5A) or externally (as depicted e.g. in FIGS. 8A-C) are examples only and may be varied depending upon the particular application. Thus, for example, any of the embodiments described with reference to FIGS. 8A-C may be implemented within the space of the arrangement, rather than externally.

By way of another example, the coupling to the slots in an accumulated fashion (as is the case with the circuitry of FIG. 5A) or at a certain point (e.g. the slot center), are non-binding examples only of coupling the magnetic energy from the slots.

By way of still another example, the induction ratio between the primary and the secondary coils, may vary depending upon the particular application.

By still another example, whereas the second circuitries described with reference to FIGS. 5 and 8, consisted of passive elements (e.g. coils), the invention is not bound by the specified example and accordingly active elements, such as an amplifier, may be utilized for coupling the magnetic energy and conveying it to the receiver.

Figure 9:
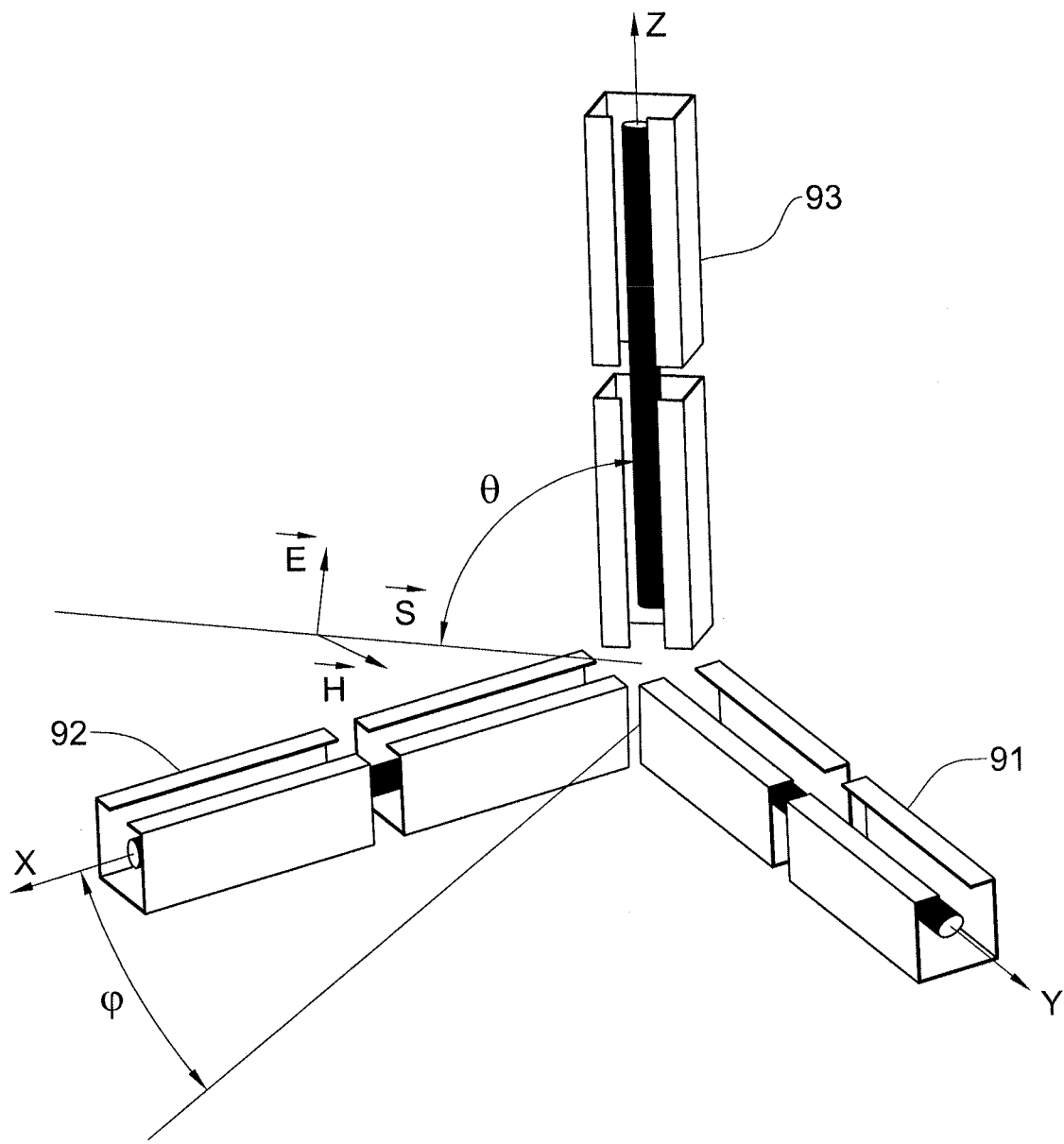
FIG. 9 illustrates an apparatus for measuring electric and magnetic field projections along perpendicular three distinct axes.

Turning now to FIG. 9, it illustrates an apparatus 90 for measuring electric and magnetic field projections along a three axes Cartesian coordinate system. Note that each arrangement (from among arrangements 91-93) has a non-zero projection on a respective axis from among the three axes. Thus, an arrangement 91 is designated to sense electric field projection along axis Y and a magnetic field projection along the same axis. Similarly, arrangement 92 is designated to sense electric field projection along axis X and a magnetic field projection along the same axis, and, likewise, arrangement 93 is designated to sense electric field projection along axis Z and a magnetic field projection along the same axis. Note that the invention is not bound by the specified multi-arrangement structure.

Note that the three axes Cartesian coordinate system can be any desired or arbitrarily selected three axes Cartesian coordinate system.

The apparatus 90 may be further implemented for calculation of the Poynting vector. The Cartesian components of the fields (electric and magnetic) are proportional to the elements' currents and therefore the components of the Poynting vector may be determined by:

$$S_x = E_y H^*_z - E_z H^*_y = k_1 k_2 (I_{y\_Edipole} I^*_{z\_Hdipole} - I_{z\_Edipole} I^*_{y\_Hdipole})$$

$$S_y = E_z H^*_x - E_x H^*_z = k_1 k_2 (I_{z\_Edipole} I^*_{x\_Hdipole} - I_{x\_Edipole} I^*_{z\_Hdipole})$$

$$S_z = E_x H^*_y - E_y H^*_x = k_1 k_2 (I_{x\_Edipole} I^*_{y\_Hdipole} - I_{y\_Edipole} I^*_{x\_Hdipole})$$

where $k_1$ and is the proportion between the E field aligned with axis of the electric dipole to its port current and $k_2$ is the proportion between the H field aligned with axis of the magnetic dipole to its port current.

Yet another manipulation of the measured data shall determine the general wavefront propagation direction $(\theta, \phi)$:

$$\varphi = a\tan\left(\frac{|S_y|}{|S_x|}\right)$$

$$\theta = a\tan\left(\frac{|S_z|}{\sqrt{|S_x|^2 + |S_y|^2}}\right)$$

Note that the so calculated $\phi$ and $\theta$ are the sought directions of arrival of the electro-magnetic (EM) wavefront.

In accordance with certain embodiments, apparatus 90 may utilize the projections of the electric field along the X, Y and Z axes to represent uniquely the EM wavefront polarization vector (i.e. the direction of the electric field) marked by $\bar{E}$ in FIG. 9 in a Cartesian coordinate system. The vector may also be represented in a different coordinate system in a known per se manner.

Figure 10:
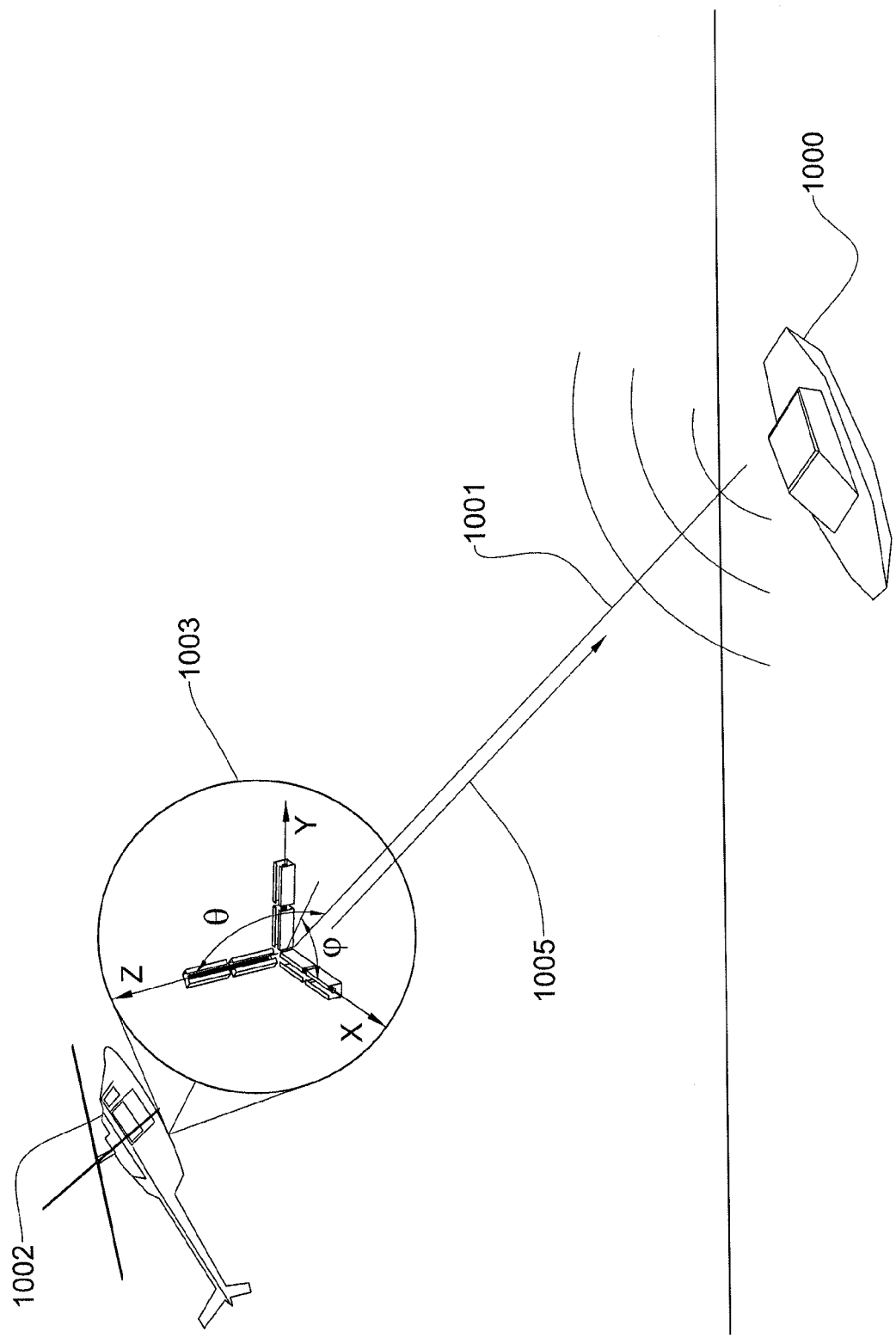
FIG. 10 illustrates an exemplary operational rescue scene utilizing e.g. the apparatus of FIG. 9.

FIG. 10 illustrates an exemplary operational rescue scene utilizing e.g. the apparatus of FIG. 9. Thus, for example, a crew (not shown) trapped on a sinking ship 1000 transmits in the international distress frequency (2.181 MHz) an SOS signal propagating radially from the ship. A rescue helicopter 1002 fitted with the apparatus 1003 of FIG. 9 (shown in enlarged and detailed form) loiters over the disaster area in an attempt to locate the trapped crew. Certain energy of the radially propagating electro-magnetic wavefront will impinge the apparatus 1003. This impinging electro-magnetic wavefront propagates along the imaginary line 1001 connecting the ship 1000 and the apparatus 1003. The apparatus will resolve $\phi$ and $\theta$ representing a direction of arrival 1005 (opposite to the direction of propagation 1001), heading the rescue helicopter towards the sinking ship. Another non-limiting implementation of the apparatus is in a stationary ground application. Thus, for example, the apparatus of FIG. 9 may be installed over a mast (or plurality of masts, which the case may be) and provide a coverage area of reception measurements which may monitor undue frequency usage that violates authorized frequency range usage license (e.g. a pirate radio broadcast station).

The invention is of course not bound by these particular examples.

Figure 11:
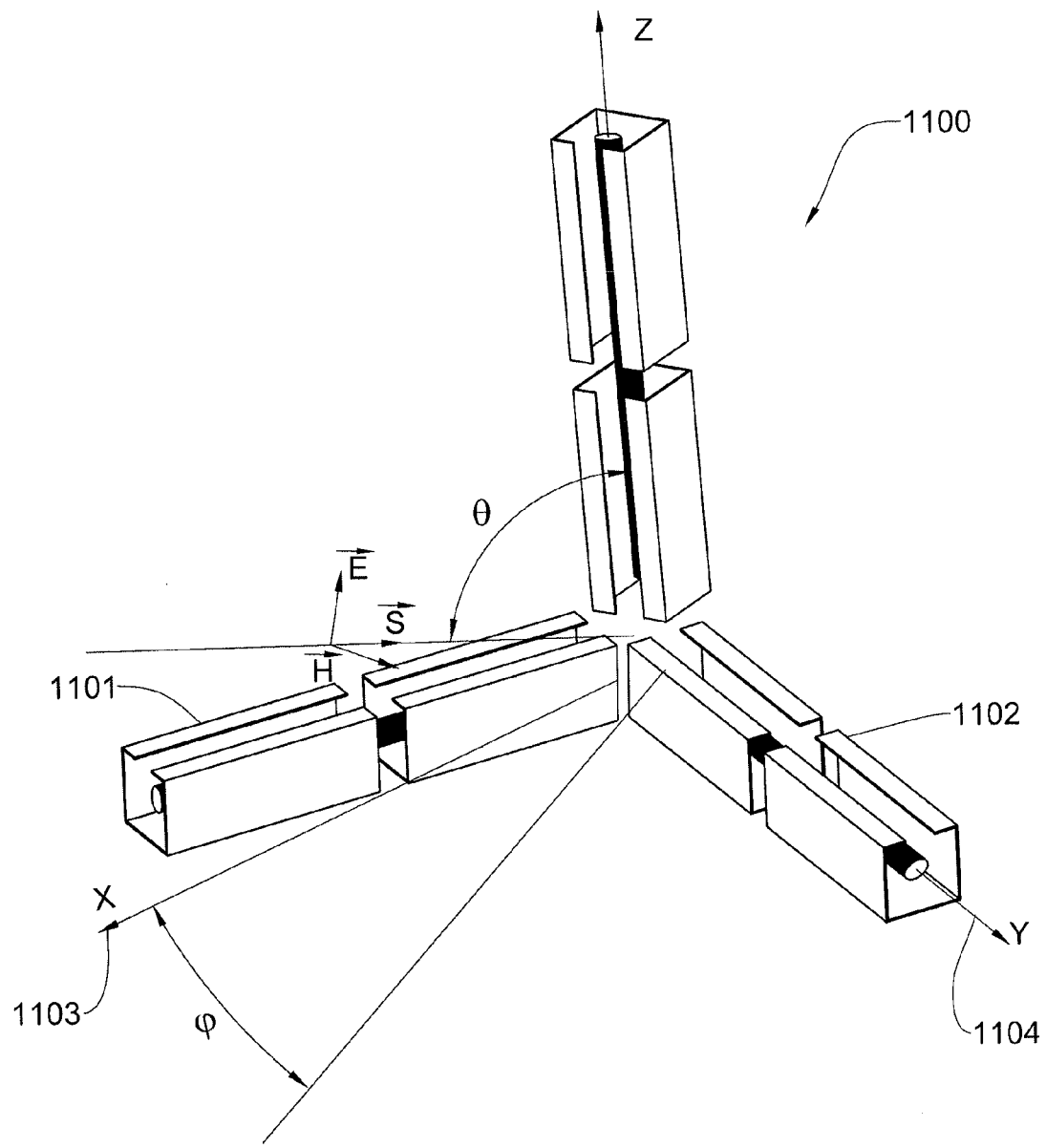
FIG. 11 illustrates an apparatus according to certain other embodiments of the invention.

While in FIG. 9 the arrangements were disposed perpendicularly to each other, the invention is not bound by this configuration. Thus, FIG. 11 illustrates an apparatus according to certain other embodiments of the invention, where in FIG. 11 arrangement 1101 is not disposed perpendicularly to arrangement 1102. Note that arrangement 1101 has not only projection on one axis (1103) but also on additional axis (1104). Those versed in the art will readily appreciate that whilst FIG. 11 demonstrates non perpendicular disposition of given two arrangements, the non perpendicular relationship can apply to any given two or even three arrangements.

It should be further noted that while in FIG. 11 arrangement 1101 had non-zero projections on two axes, this characteristic may apply to any other arrangement instead of or in addition to the specified arrangement 1101. It should be noted that in certain other embodiments at least one of the arrangements may have non-zero projections on all of the three axes.

Note that in certain embodiments, each one of said arrangements is spaced apart relative to origin of an arbitrary Cartesian system at a respective distance that falls in the range of 0 to $\lambda_{MIN}$, where $\lambda_{MIN}$ corresponds to the highest frequency of a decade frequency band.

While FIGS. 9 and 11 each describe a single apparatus, an embodiment may include a plurality of such apparatus. A non limiting example of utilizing more than one apparatus is described with reference to FIG. 12 where apparatuses (1201, 1202) are installed substantially symmetrically over a substantially symmetric object 1200 (e.g. a prism having a symmetric plan 1203) to independently resolve properties of the EM wavefront such as direction and polarization (referred to as results) The prism and the two apparatuses are also shown for clarity (and for illustrative purposes only, i.e., the geometric dimensions are not accurate) in side 1204 front 1205 and plan views 1206. Note that the apparatuses installation may be achieved by coupling them to the object, e.g. through a known per se non-galvanic connector (not shown in the Fig). The Directional/polarization results resolved independently in respects of each of the apparatuses, may be merged, e.g. by applying an average to resolve a combined result. Note that the utilization of two or more apparatuses in accordance with the invention is not bound by the specified symmetric constraints. Note that by this embodiment each apparatus may be composed of three orthogonal arrangements (where each arrangement is of the kind described by way of example as 50 in FIG. 5A). Thus, in order to resolve the specified result for apparatus 1201 it is required to obtain for each of the three orthogonal arrangements both the electric field projection and the magnetic field projection (see 53 and 58 respectively of FIG. 5A), namely 6 measurements per apparatus and all together 12 measurements for both apparatuses 1201 and 1202.

In accordance with certain embodiments, the number of measurements may be reduced to 6 combined measurements (instead of 12) for resolving the specified combined result. More specifically, and reverting again to FIG. 12, the apparatuses (1201,1202) are coupled substantially symmetrically over a substantially symmetric object 1200 (having a symmetric plan 1203) in a manner that substantially maintains the original symmetric plan 1203 when considering the consolidated structure that is composed of the object (e.g. 1200) and the apparatuses (1201 and 1202).

Figure 12:
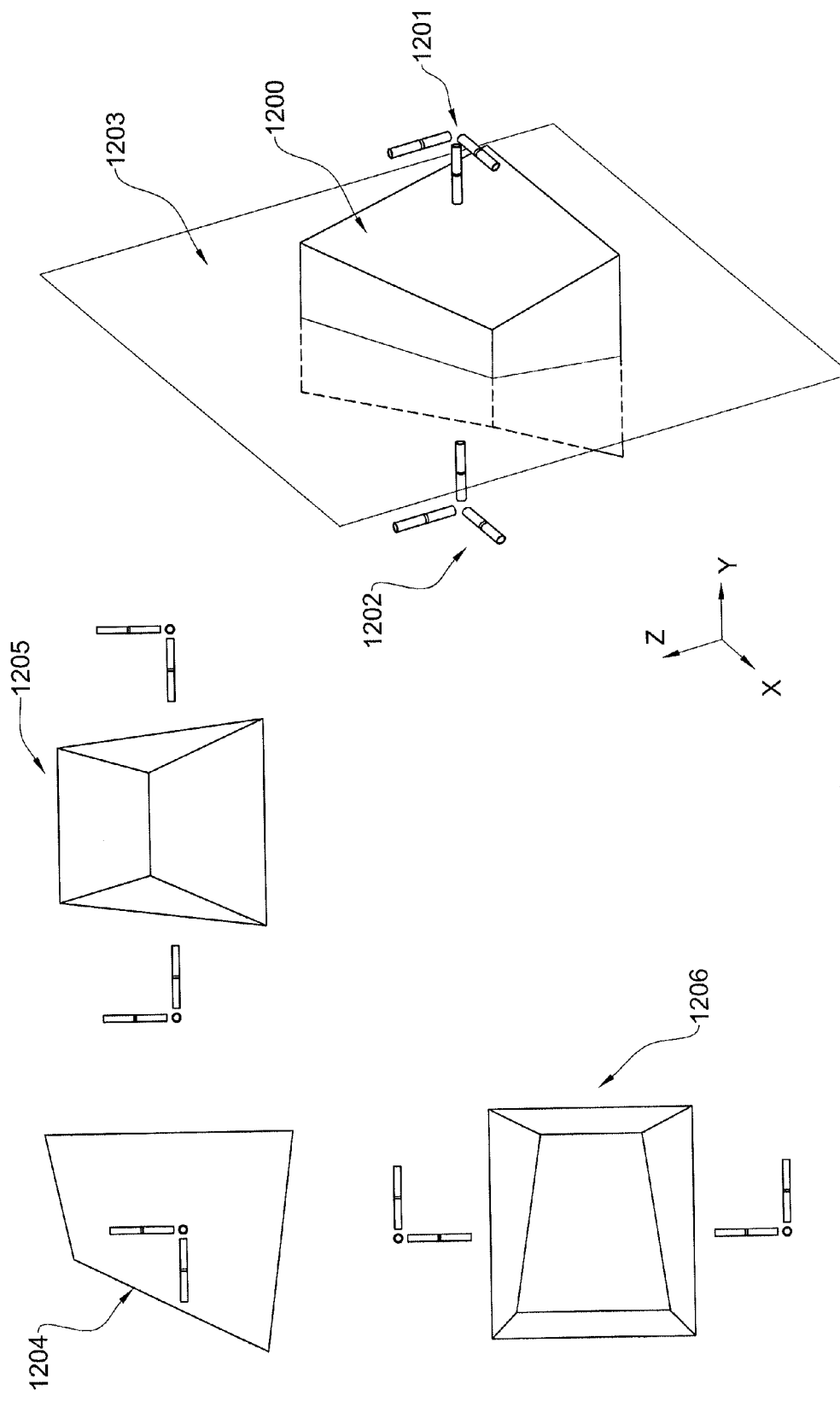
FIG. 12 illustrates two apparatuses coupled symmetrically along an object according to certain other embodiments of the invention and, FIG. 13 illustrates eight apparatuses coupled symmetrically along a cube representing an object with high degree of symmetry according to certain other embodiments of the invention.

Thus, in order to resolve the specified combined result, the electric field projections 53 of the Z axis arrangements (of apparatus 1201 and 1202) will be combined through a combiner (not shown in FIG. 12). Similarly, the magnetic field projections 58 of the Z axis arrangements (of apparatus 1201 and 1202) will be combined. In a similar fashion, the electric and magnetic fields projections will be combined for the Y axis arrangements (of apparatus 1201 and 1202) as well as for the X axis arrangements (of apparatus 1201 and 1202), giving rise to only 6 measurements (i.e. three combined electric field projections and three combined magnetic field projections) for both apparatuses 1201 and 1202.

Note that in accordance with certain embodiments, the combination applied for the Y axis arrangements being subtraction, whereas the combination applied for both the Z axis and X axis combinations being summation. Note that the invention is by no means bound by the specified manner of combination.

Whereas the description with reference to FIG. 12, referred to a prismatic object, those versed in the art will readily appreciate that the invention is not bound by this particular geometric form.

Figure 13:
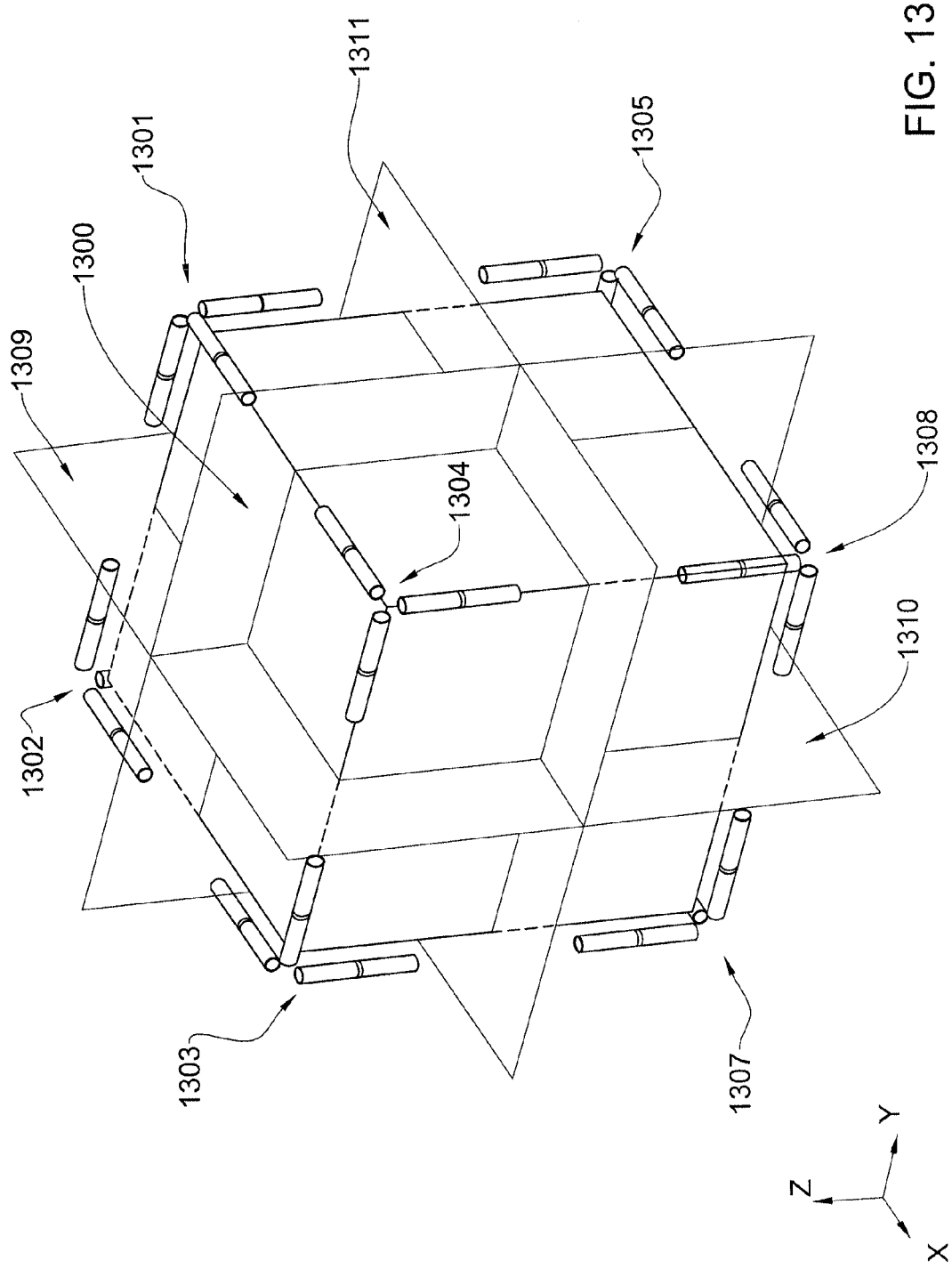

In accordance with certain embodiments there may be more than two apparatuses that are coupled to the object. Attention is now drawn to FIG. 13, illustrating eight apparatuses coupled substantially symmetrically along a cube representing an object with more symmetric plans. Note that the description below refers to a cubical object for illustrative purposes only and the invention is by no means bound to the cube form. It should be further noted that for a cubical object there may be scenarios where only two apparatuses are utilized as described in detail with reference to FIG. 12 above.

Thus, a first pair 1301,1302 of apparatuses is combined to give rise to 6 combined measurements (as described above with reference to FIG. 12). In a similar fashion a second (1303,1304) third (1305 and another apparatus not shown) and fourth pairs (1307,1308) are combined each to a respective 6 combined measurements. Next, the so obtained 24 combined measurements may be further combined e.g. by combining the combined measurements of the first pair with those of the second pair and those of the third pair with those of the fourth pair, giving rise to only 12 combined measurements, which in their turn may be also combined to give rise to only 6 combined measurements from which the combined result (i.e. at least direction) are resolved.

Figure 14:
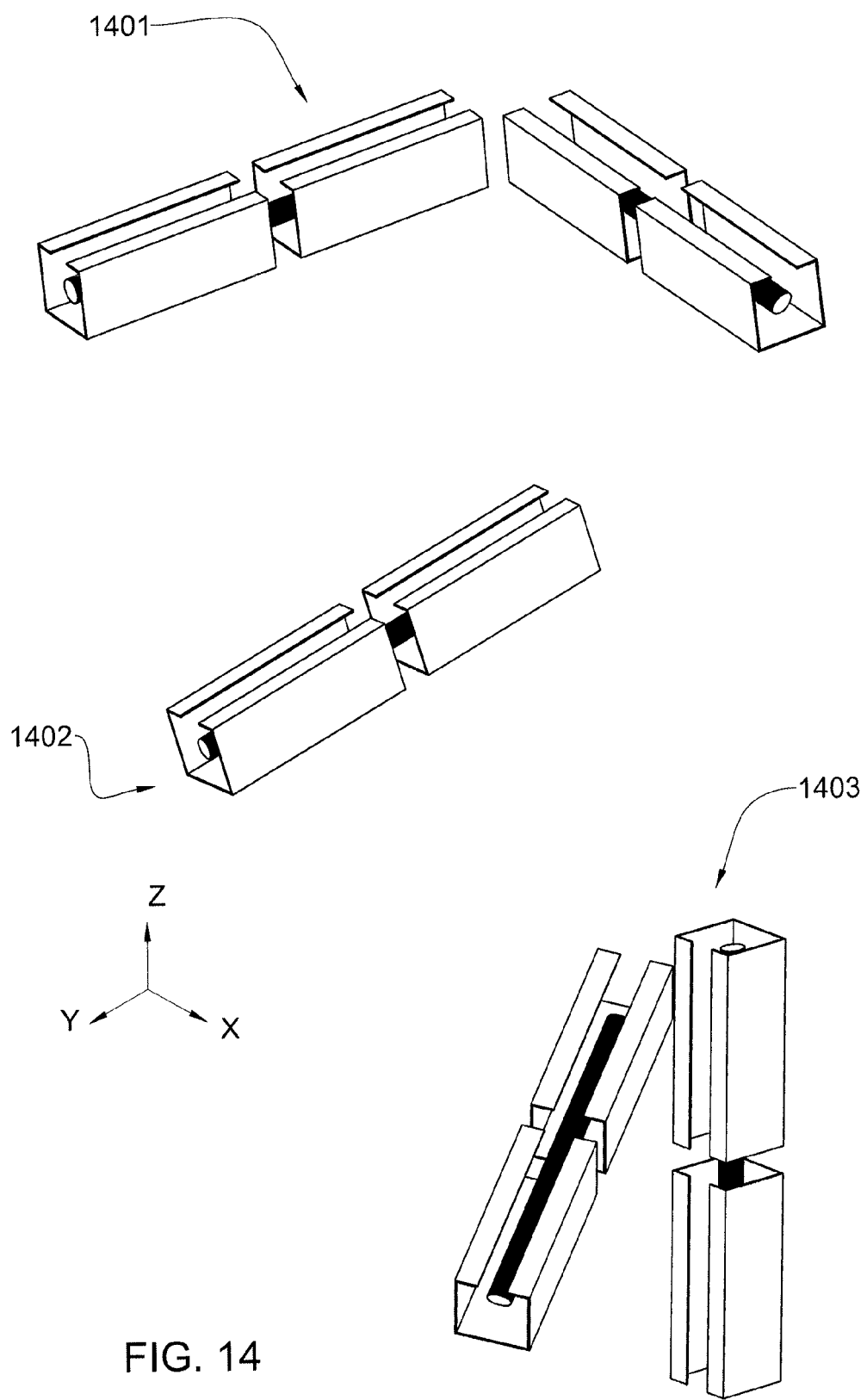
FIG. 14 illustrates an apparatus according to certain other embodiments of the invention.

Note that in the case that each apparatus comprises less than three arrangements (as illustrated e.g. with reference to FIG. 14, the combination of the electric and magnetic field projections applies mutatis mutandis.

Turning now to FIG. 14, it illustrates an apparatus according to certain other embodiments of the invention. Each apparatus in such an embodiment may be complete (i.e. includes three non-coinciding arrangements with non-zero projections on a Cartesian axis) or partial as long as there is at least one non-zero projection arrangement on any Cartesian axis. In FIG. 14 each apparatus 1401, 1402 and 1403 includes less than three non-coinciding arrangements with non-zero projections on a Cartesian Coordinate system, however overall there is at least one non-zero projection arrangement for the axis of the Cartesian coordinate system.

The subject matter of the present invention has been described with a certain degree of particularity, but those versed in the art will readily appreciate that the invention is not thus limited. Numerous modifications, changes and improvements within the scope of the invention will now occur to the reader.

The antenna according to the subject matter of the present application can have features of different aspects described above, or their equivalents, in any combination thereof, which can also be combined with any feature or features of the antenna described in the Detailed Description presented above, or their equivalents.

The invention claimed is:

1. An apparatus, comprising:
at least two non-coinciding arrangements disposed in an at least two axes Cartesian coordinate system such that each arrangement having a non-zero projection on a respective axis from among said at least two axes;
each one of said arrangements includes at least one pair of oppositely directed, spaced apart, co-axial radiating-capable elements, each of said elements being hollow with internal space, and being slotted throughout its entire extent;
a first circuitry coupled to said arrangement and being configured to sense an electric field projection along said axis and to convey it to a first feeding terminal;
a second circuitry coupled to at least one slot of said arrangement configured to sense a magnetic field's projection along said axis and to convey it to a first feeding terminal,
wherein said second circuitry includes passive elements,
wherein said passive elements include at least one magnetic element accommodated within the spaces of said at least one pair of elements and extending along a major portion of the elements' longitudinal extent,
wherein said magnetic element includes a multi-turn loop over a ferrite rod; and
wherein the multi turn loop over ferrite rod is implemented by two opposing sense windings over the ferrite rod.

2. The apparatus according to claim 1 wherein an even number of said opposing sense windings are parallel combined.

* * * * *